United States Patent [19]

Taylor

[11] Patent Number: 5,391,252

[45] Date of Patent: Feb. 21, 1995

[54] PLASMA PRESSURE CONTROL ASSEMBLY

[75] Inventor: William D. Taylor, Sandy Hook, Conn.

[73] Assignee: Hughes Aircraft Company, Los Angeles, Calif.

[21] Appl. No.: 252,630

[22] Filed: Jun. 2, 1994

Related U.S. Application Data

[63] Continuation of Ser. No. 986,649, Dec. 8, 1992, abandoned.

[51] Int. Cl.$^6$ .............................................. C23F 1/42
[52] U.S. Cl. .................................................. 156/345
[58] Field of Search ............................ 156/345, 643; 118/723 E, 723 I, 723 IR; 427/569; 315/111.21, 111.71

[56] References Cited

U.S. PATENT DOCUMENTS

| | | | |
|---|---|---|---|
| 2,685,535 | 8/1954 | Nack | 118/723 E |
| 4,367,114 | 1/1983 | Steinberg | 156/345 |
| 4,380,488 | 4/1983 | Reichelderfer | 156/643 |
| 4,473,437 | 9/1984 | Higashikawa | 156/345 |
| 4,501,766 | 2/1985 | Suzuki | 118/723 E |
| 4,512,283 | 4/1985 | Bonifield | 118/723 E |
| 4,668,366 | 5/1987 | Zarowin | 204/192.1 |
| 4,767,641 | 8/1988 | Kieser | 315/111.21 |
| 4,962,727 | 10/1990 | Harada | 118/723 |
| 4,988,533 | 1/1991 | Freeman | 427/38 |
| 5,013,400 | 5/1991 | Kurasaki | 156/643 |
| 5,039,625 | 8/1991 | Reisman | 437/69 |
| 5,049,523 | 9/1991 | Coleman | 437/101 |
| 5,113,790 | 5/1992 | Geisler | 118/723 E |
| 5,266,153 | 11/1993 | Thomas | 156/643 |

FOREIGN PATENT DOCUMENTS

| | | | |
|---|---|---|---|
| 0384754 | 8/1990 | European Pat. Off. | |
| 0492511 | 7/1992 | European Pat. Off. | |
| 0096724 | 5/1986 | Japan | 118/723 E |
| 0186419 | 8/1988 | Japan | 118/723 E |
| 1247573 | 10/1989 | Japan | 118/723 |
| 3120362 | 5/1991 | Japan | 315/111.21 |
| 3120720 | 5/1991 | Japan | 315/111.21 |

OTHER PUBLICATIONS

Patent Abstracts of Japan, vol. 12, No. 165 (C-496) 18 May 1988 (abstract).

"Review of precision surface generating processes and their potential application to the fabrication of large optical components", Stowers et al. (1988) pp. 62-73 SPIE.

"A comparison using Surface Evolution Theory of the Smoothing and Figuring of optics by Plasma Assisted Chemical Etching and Ion Milling", (1991) Zorowin pp. 22-26 SPIE vol. 1618.

"Rapid, Non-Contact, damage free shaping of optical & other surfaces with plasma assisted chemical etching". Zarowin et al. (1989) IEEE, pp. 623-626.

"Rapid-Non-Contect optical figuring of aspheric surfaces of plasma assisted chem. Etching (PACE)", Bollinger (1990) SPIE vol. 1333 pp. 44-57.

"Rapid nonmechanical, damage-free figuring of optical surfaces using plasma-assisted chemical etching (PACE): Part I Exp. Results" Bollinger et al. (1988) SPIE pp. 82-90.

"Rapid optical figuring of aspherical surfaces of plasma assisted Chem. etch". SPIE Bollinger et al. (1991) pp. 14-21.

Roth, "Vacuum Technology," 1976 North-Holland Publishing Co. pp. 274-327.

Primary Examiner—R. Bruce Breneman
Assistant Examiner—Joni Y. Chang
Attorney, Agent, or Firm—M. E. Lachman; M. W. Sales; W. K. Denson-Low

[57] ABSTRACT

A plasma assembly including an RF head extending into a vacuum chamber and an associated electrode for generating a confined plasma. The assembly includes a sidewall within the chamber forming a plenum about the RF head. The plenum defines a volume substantially smaller than the volume of the chamber and hence, the gas pressure within the plenum is more easily monitored and controlled by the provision of make-up gas.

16 Claims, 3 Drawing Sheets

PLASMA PRESSURE CONTROL ASSEMBLY

This is a continuation application Ser. No. 07/986,649, filed Dec. 8, 1992, now abandoned.

BACKGROUND OF THE INVENTION

The present invention generally relates to a plasma pressure control assembly and, in particular, relates to one such assembly having a wall surrounding an RF head assembly and extending closer to the surface to be etched than the RF head.

In one type of plasma assisted chemical etching reactor system, an RF head assembly having an RF electrode associated therewith extends into a reaction chamber such that a plasma can be created between a surface to be etched and the RF electrode. Further, in order to more selectively control the etching of the surface, the RF head, and hence the plasma footprint, is made small with respect to the surface and relative movement is introduced between the RF head and the surface.

In order to provide a uniform plasma, the entire chamber within which the etching occurs must be maintained at a particular pressure. That is, the plasma, in order to have and maintain desired characteristics, such as diameter, etchant gas concentration, and so forth, should be formed in a known and controlled ambient. Variations in the ambient during the plasma etching process can result in variations in the plasma itself and, thus, a departure from the intended etching of the surface.

In general, one mechanism for controlling the etching plasma within the reactor chamber is by regulating the static background pressure of the ambient to values ranging, for example, from 1 to 10 Torr.

One particular technique for controlling the static background pressure of the reaction chamber is by introducing a make-up gas into the reactor chamber. In conventional chambers, the amount of make-up gas needed is dependent on, among other factors, the overall volume of the reaction chamber. The make-up gas is, typically, the same composition as the reactant gas supplied to the etching plasma. As plasma reactor chambers become larger with respect to the size of the RF electrode, the required volume of make-up gas needed can exceed that needed for supporting the actual plasma. Further, the flow rate of the make-up gas must be increased in order to ensure a constant static background pressure within the reactor chamber. In addition, the increased volume of the reaction chamber inherently permits the creation of pressure gradients within the chamber. Thus, the supplying of make-up gas and its effects becomes a process factor that cannot be ignored.

In addition, the increased volume and flow rate of make-up gas used during the etching process causes particulates to become entrained and distributed about the chamber in accordance with the flow patterns established by the combination of the vacuum system, the flow of the make-up gas and the plasma reactants. These particulates become the stirred contaminants during pump-down and some may chemically interact with the chamber itself and thus result in further contamination.

In light of the above, it is clear that a plasma pressure control assembly is needed that more precisely and economically controls the pressure of an etching plasma.

SUMMARY OF THE INVENTION

Accordingly, it is one object to the present invention to provide a plasma pressure control assembly that overcomes the drawbacks discussed above.

The object is accomplished, at least in part, by the creation of a plenum between a side wall and the RF head such that the plenum surrounds the RF head and extends closer to the surface to be etched than the RF head itself.

Other objects and advantages of the present invention will become apparent to those skilled in the art from the following detailed description of the invention read in conjunction with the appended claims.

BRIEF DESCRIPTION OF THE DRAWINGS

The drawings, not drawn to scale, includes.

DETAILED DESCRIPTION OF THE INVENTION

Figure 1:
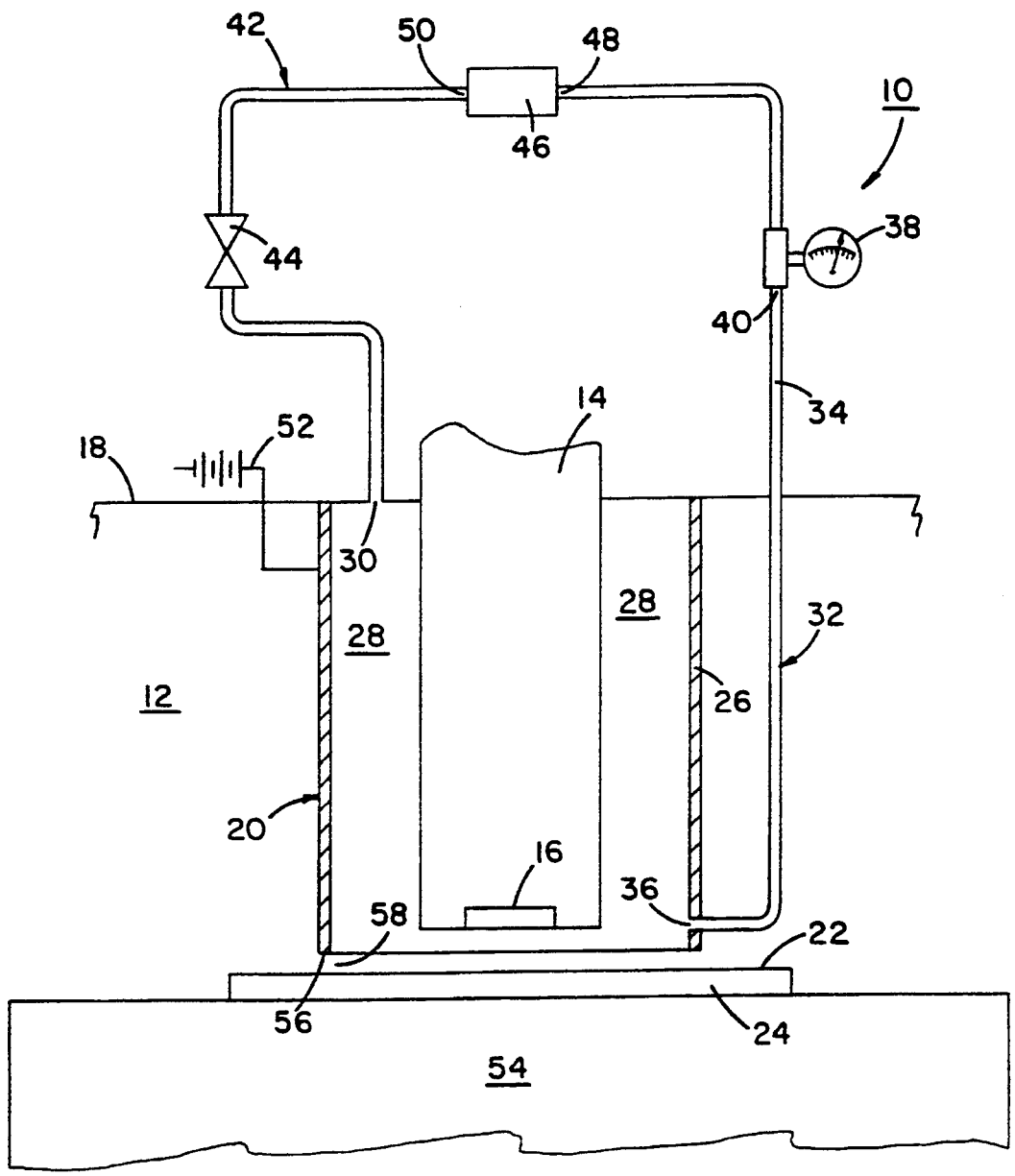
FIG. 1 is a cross-sectional view of a plasma pressure control assembly embodying the principles of the present inventions.

A plasma pressure control assembly, generally indicated at 10 in FIG. 1 and embodying the principle of the present invention, includes a vacuum chamber 12 having an RF head 14 having an RF electrode 16 extending through a wall 18 thereof into the chamber 12 and including means 20 for controlling the plasma pressure between the RF electrode 16 and a surface 22 of a workpiece 24 to be etched. The means 20 for controlling the plasma pressure includes a sidewall 26 surrounding the RF head 14 and extending closer to the surface 22 to be etched than the RF electrode 16 such that a plenum 28 is established about the RF head 14.

In the embodiment shown in FIG. 1, the means 20 further includes a make-up gas inlet 30 extending through the wall 18 of the chamber 12 such that make-up gas can be supplied into the plenum 28. The assembly 10 also includes means 32 for monitoring the pressure within the plenum 28. In the embodiment, shown in FIG. 1, the means 32 includes a pressure probe 34 extending through the wall 18 at one end 36 thereof and connecting to a pressure monitoring device 38, such as, for example, a manometer, at the other end 40 thereof.

Preferably, the assembly 10 also includes a plenum pressure control means 42 which, in one embodiment, includes a pressure control valve 44 and a gas flow controller 46. In one exemplary embodiment of the plenum pressure control means 42, the pressure monitoring means 32 is connected to one side 48 of the gas flow controller 46 and the pressure control valve 44 is connected to the output 50 of the gas flow controller 46. In the preferred embodiment, the gas flow controller 46 monitors the gas pressure of the plenum 28 and controls the pressure control valve 44 in response thereto to ensure that the pressure within the plenum 28 is maintained at a preselected level.

In addition, in the embodiment shown in FIG. 1, the assembly 10 further includes a means 52 for providing an electrical bias on the sidewall 26. Further, in this particular embodiment, the workpiece 24 is disposed upon a platen 54 which is adapted to provide relative motion between the RF head 14 and the workpiece 24.

In operation, the one end 36 of the means 38 for monitoring the pressure within the plenum is located close to the edge 56 of the sidewall 26 proximate the surface 22. Hence, the means 38 for monitoring the gas pressure within the plenum 28 provides an accurate indication of the make-up gas pressure at the point close to the operating plasma. In the embodiment shown in FIG. 1, the make-up gas and the by-products of the plasma etching process are exhausted to the vacuum system, not shown in the drawing, through the gap 58 between the edge 56 of the sidewall 26 and the surface 22 of the workpiece 24.

In one specific embodiment wherein the workpiece 24 is silicon the plasma and the make-up gas will generally include gases such as $SF_6$, $CF_4$, $O_2$ Ar, $N_2$ or various combination thereof. It is understood that other gases may be used depending on, inter alia, the material of the workpiece 24. Hence, the exemplary gases stated herein are not to be considered a limitation of the present invention. In such an environment, the sidewall 26 can be fabricated from 304L or 316L stainless steel, having, for example, a thickness between about 1.5 mm (1/16 th inch) and 3.2 mm (⅛th inch). In general, however, the sidewall 26 is fabricated from a material that is inert to the etching plasma. Preferably, the sidewall 26 is disposed such that the plenum 28 is between about 1.25 cm (½ inch) and 2.5 cm (1 inch) wide. Further, the gap 58 in this embodiment, is between about 0.5 mm and 1.5 mm. This gap 58 is adjusted, for example, depending upon the size of the workpiece 24 and speed that the workpiece 24 moves relative to the RF head 14. For example, for maximum effect and efficiency it appears best to maintain a high degree of accuracy of the gap 58 during the processing in order to obtain close control over the pressure in the plenum 28. If, for example, the platen 54 is moving rapidly there is a tendency to induce a wobble type motion in the workpiece 24. Such a wobble will vary the size of the gap 58 and thus the pressure in the plenum 28.

Although the sidewall 26 is depicted herein as being circular about the RF head 14, it will be understood that it can assume any surrounding shape. However, only a circular cross-sectional shape has no corners that may trap process particulates that could contaminate the plasma 28.

Figure 2:
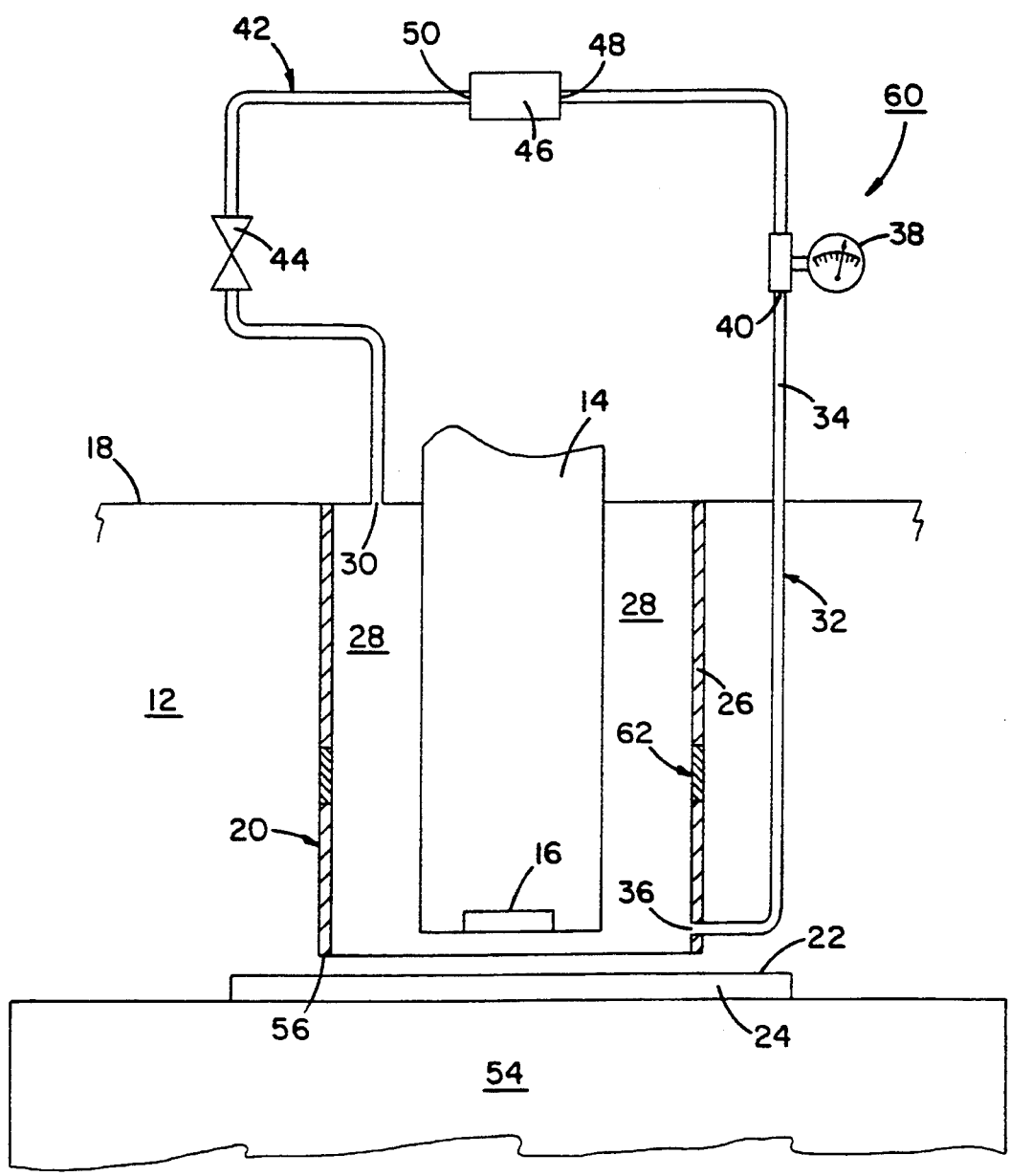
FIG. 2 is a cross-sectional view of another plasma pressure control assembly embodying the principles of the present invention.

A second assembly, generally indicated at 60 in FIG. 2 and embodying the principles of the present invention, includes another form of a means 20 of controlling the plasma pressure by means of a sidewall 26. In FIG. 2, for consistency and clarity, elements previously discussed herein with respect to FIG. 1 are identified be common numerals. As shown in FIG. 2, the sidewall 26 includes a plurality of portions 62 formed from material that is porous with respect to the make-up gas. In the example given above wherein the material of the workpiece 24 was silicon, and the general gas composition set forth herein above, the material of the porous portions can be, preferably, sintered stainless steel. The size and number of porous portions 62 selected depends on various system factors, such as, the desired pressure of the make-up gas, the available pressure for supplying the gas, the pressure of the plasma gas, the control capability of the vacuum system of the chamber 12, etc. In one embodiment, each porous portion 62 is generally circular in shape with each having a diameter on the order of about 1.2 cm (½ inch) and, in this example, there are about 4–8 such porous portions 62 in the sidewall 26. Operationally, the porous portions 62 function similar to the gap 58 of the assembly 10 shown in FIG. 1. However, by use of the porous portions 62, a greater control over the pressure within the plenum 28 and hence, the greater control over the plasma is achieved. It should be noted that the one end 36 of the pressure probe 34 of the means 32 for monitoring the pressure of the gas within the plenum 28 remains positioned between the porous portion 62 and the edge 56 of the sidewall 26 proximate the surface 22 of the workpiece 24. An additional benefit of utilizing the porous portion 62 instead of relying on the gap 58, is that the porous portions 62 serve as contamination filters.

More specifically, regardless of the specific implementation, whereas the introduction of the sidewall 26 reduces the exposure of the workpiece 24 to air-borne particulates during chamber pump-down, the porous portions 62 act as additional efficient filters. It will be understood that the sidewall 26 generally acts as a baffle to prevent most air-borne particulates from reaching the workpiece 24.

Figure 3:
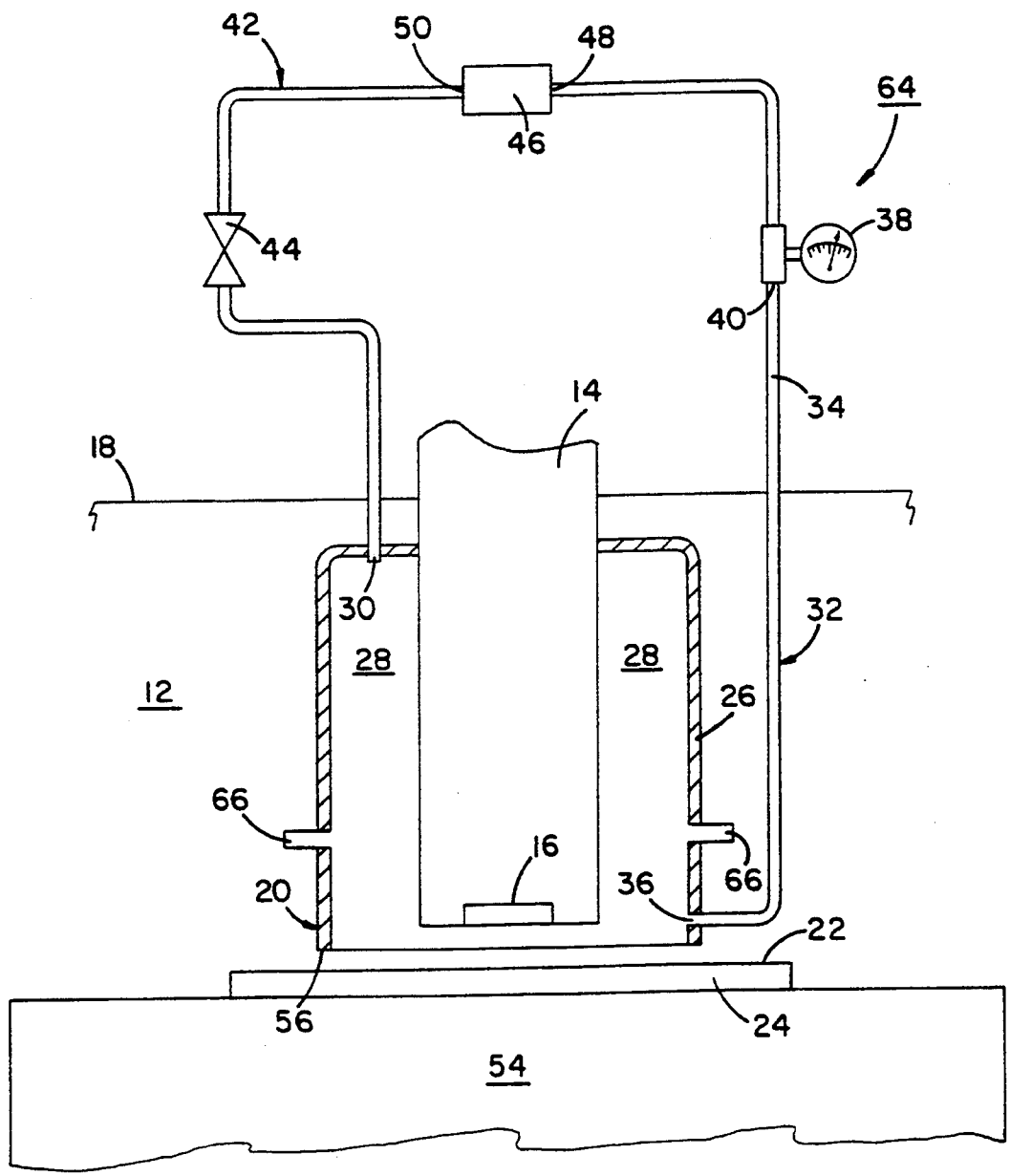
FIG. 3 is a cross-sectional view of still another plasma pressure control assembly embodying the principle of the present invention.

A third assembly, generally indicated at 64 in FIG. 3 and embodying the principles of the present invention, includes another means 20 for controlling the plasma pressure. As with the assembly 60 shown in FIG. 2, the assembly 64 shown in FIG. 3 has elements that have been previously discussed identified by like numerals. In this particular embodiment, the means 20 includes a plurality of openings 66 extending through the sidewall 26. The end 36 of the pressure probe 34 communicating with the pressure monitoring means 38 is disposed between the plurality of openings 66 and the edge 56 of the sidewall 26 proximate the surface 22 of the workpiece 24. Again, as discussed above, the size, number and location of the openings 66 is determined by the parameters of the system and the gas mechanics thereof.

In addition, the assembly 66 depicts an arrangement of an assembly 66 particularly useful is a plasma system wherein the RF head 14 is translated with respect to the surface 22 that is being etched. In such an instance, the sidewall 26 of the assembly 64 extends proximate the wall 18 of the chamber 12 and is affixed to the RF head 14 thereby defining the plenum 28. In such an embodiment the make-up gas inlet 30 and the pressure probe 34 of the means 32 for monitoring the gas pressure are adapted to move with the RF head 14.

Hence, the assembles, 10, 60, and 64, provide advantages that previously have been unavailable in confined plasma systems. In particular, the assemblies, 10, 60, and 64, accurately control the gas pressure in the vicinity of the etching plasma without excessive use of make-up gases, control particulate contamination migration from the vacuum chamber 12 to the etch site during chamber pump-down and during the etching process and prevent chemical interaction between the plasma and/or its by-products with the remainder of the chamber 12 by the choice of the material of the sidewall 26.

Although the present invention has been described hereinabove with respect to one or more specific embodiments, it will be understood that other arrangements and configurations may be made without departing from the spirit and scope hereof. Hence, the present invention is deemed limited only by the appended claims and the reasonable interpretation thereof.

What is claimed is:

1. A plasma assembly comprising:

means, disposed within a vacuum chamber for generating a confined plasma, said means including an RF head having an RF electrode disposed proximate a surface and spaced therefrom wherein said RF electrode has a surface area which is smaller than said surface;

means for controlling the plasma pressure between said RF electrode and said surface, said plasma pressure control means comprising:

a sidewall surrounding said RF head and said RF electrode, located entirely within and affixed within said chamber at one end thereof and extending closer to said surface than said RF electrode such that a controlled plasma pressure region is formed between said RF electrode and said surface wherein said sidewall and said RF head define a plenum region therebetween;

means for introducing a make-up gas into said plenum region;

means for enabling said make-up gas to exit said controlled plasma pressure region; and means for monitoring the pressure within said plasma pressure region.

2. The assembly as claimed in claim 1, wherein said means for monitoring the pressure within said region includes a manometer.

3. The assembly as claimed in claim 1, wherein said means for introducing a make-up gas includes a gas flow controller and a pressure control valve.

4. The assembly as claimed in claim 1, wherein said make-up gas exiting means includes a plurality of porous portions, said porous portions being disposed between said means for introducing said make-up gas and said surface.

5. The assembly as claimed in claim 4, wherein said sidewall in formed from stainless steel and said porous portions are formed from sintered stainless steel.

6. The assembly as claimed in claim 1, wherein said make-up gas exiting means includes at least one opening through said sidewall.

7. The assembly as claimed in claim 6 wherein said at least one opening is disposed between said means for introducing said make-up gas and said surface.

8. The assembly as claimed in claim 1, wherein said sidewall is affixed to a wall of said vacuum chamber.

9. The assembly as claimed in claim 1, wherein said sidewall is affixed to said RF head.

10. The assembly as claimed in claim 9, wherein said sidewall is adapted to move with said RF head, said RF head being adapted to move in a horizontal direction with respect to said surface.

11. The assembly as claimed in claim 1, further comprising: means for establishing an electrical charge on said sidewall.

12. The assembly as claimed in claim 11, wherein said electrical charge is opposite to the species of ions created by said confined plasma.

13. The assembly as claimed in claim 1, wherein said sidewall is stainless steel and has a thickness of between about 1/16th inch and $\frac{1}{8}$th inch.

14. The assembly as claimed in claim 1, wherein said sidewall extends to within $\frac{1}{2}$ to $\frac{1}{2}$ mm of said surface.

15. The assembly as claimed in claim 14 wherein said surface is a surface of a semiconductor wafer.

16. The assembly as claimed in claim 15, wherein said semiconductor is disposed on a platen that is moveable in a horizontal direction with respect to said RF head.

* * * * *